(12) United States Patent
Ejiri

(10) Patent No.: US 7,005,384 B2
(45) Date of Patent: Feb. 28, 2006

(54) CHEMICAL MECHANICAL POLISHING METHOD, AND WASHING/RINSING METHOD ASSOCIATED THEREWITH

(75) Inventor: Kazuaki Ejiri, Kanagawa (JP)

(73) Assignee: NEC Electronics Corp., Kanagawa (JP)

( * ) Notice: Subject to any disclaimer, the term of this patent is extended or adjusted under 35 U.S.C. 154(b) by 0 days.

(21) Appl. No.: 10/749,599

(22) Filed: Dec. 31, 2003

(65) Prior Publication Data

US 2004/0152325 A1 Aug. 5, 2004

(30) Foreign Application Priority Data

Jan. 31, 2003 (JP) ............................. 2003-024717
Dec. 2, 2003 (JP) ............................. 2003-403101

(51) Int. Cl.
*H01L 21/461* (2006.01)
(52) U.S. Cl. ..................................... 438/693; 438/749
(58) Field of Classification Search ........ 438/689–694, 438/704, 745–751, 780, 790, 963, 972
See application file for complete search history.

(56) References Cited

U.S. PATENT DOCUMENTS 6,616,717 B1 * 9/2003 Sachan et al. ................. 51/298
2004/0162011 A1 * 8/2004 Konno et al. .................. 451/41

FOREIGN PATENT DOCUMENTS

| JP | H10-510399 | 10/1998 |
| JP | 2001-514802 | 9/2001 |
| JP | 2002-009151 | 1/2002 |

* cited by examiner

*Primary Examiner*—David Nelms
*Assistant Examiner*—Calvin Lee
(74) *Attorney, Agent, or Firm*—Muirhead and Saturnelli, LLC

(57) ABSTRACT

In a chemical mechanical polishing method for polishing a low-k material insulating layer formed on a semiconductor wafer, aqueous abrasive slurry composed of a water component, an abrasive component, a first additive for making the low-k material insulating layer of the semiconductor wafer hydrophilic in nature, and a second additive for adding acidity to the aqueous abrasive slurry, is prepared. The aqueous abrasive slurry is feed to a rotating polishing pad having a larger diameter than that of the semiconductor wafer. The low-k material insulating layer of the semiconductor wafer is applied and pressed onto the rotating polishing pad while rotating the semiconductor wafer in the same rotational direction as that of the rotating polishing pad, whereby a polishing rate of the low-k material insulating layer of the semiconductor wafer is improved.

12 Claims, 6 Drawing Sheets

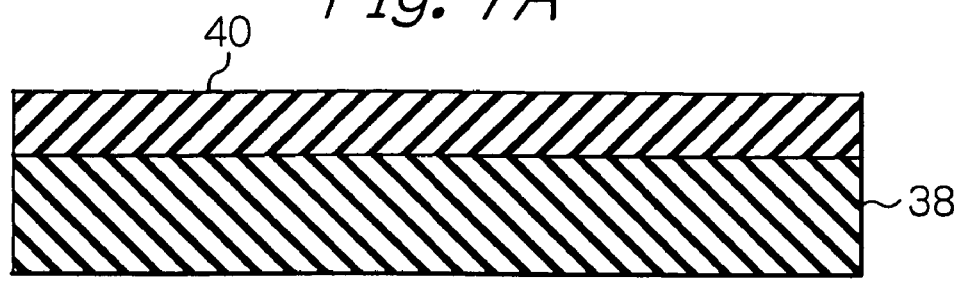
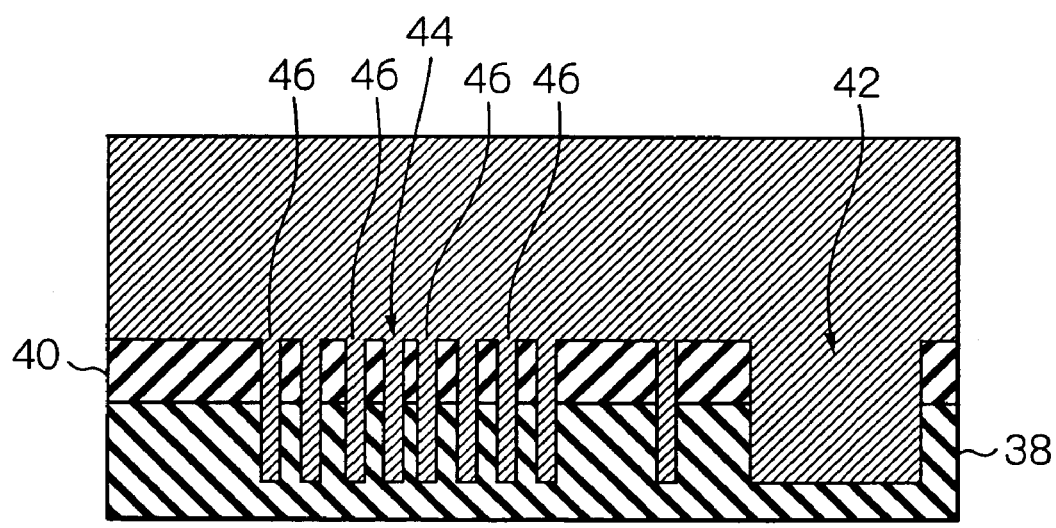
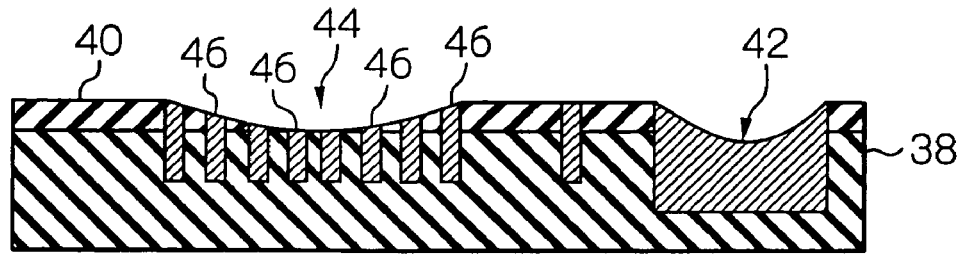

CHEMICAL MECHANICAL POLISHING METHOD, AND WASHING/RINSING METHOD ASSOCIATED THEREWITH

BACKGROUND OF THE INVENTION

1. Field of the Invention

The present invention relates to a chemical mechanical polishing (CMP) method for polishing a surface of a semiconductor wafer to thereby planarize the same in a process of producing a plurality of semiconductor devices in the semiconductor wafer, and a washing/rinsing method for removing residual substances from the polished surface of the semiconductor wafer.

2. Description of the Related Art

In a representative process of producing a plurality of semiconductor devices, for example, a silicon wafer is prepared, and a surface of the silicon wafer is sectioned into a plurality of semiconductor chip areas by forming grid-like fine grooves (i.e. scribe lines) in the silicon wafer. Then, the silicon wafer is processed by various well-known methods such that each of the semiconductor chip areas is produced as a semiconductor device. Subsequently, a multi-layered wiring arrangement is formed on the surface of the silicon wafer, using a chemical vapor deposition (CVD) process, a sputtering process, a photolithography process, an etching process, and so on.

Usually, the multi-layered wiring arrangement includes a lowermost insulating layer formed on the surface of the silicon wafer and having a plurality of metal wiring patterns formed thereon, an uppermost insulating layer having a plurality of metal wiring patterns formed thereon, and at least one insulating interlayer provided between the lowermost and uppermost insulating layers and having a plurality of metal wiring patterns. Each of the lowermost and uppermost insulating layers is formed as a silicon dioxide layer by the CVD process, and the insulating interlayer is also formed as a silicon dioxide layer by the CVD process. The formation of each plurality of metal wiring patterns is carried out by the sputtering process, the photolithography process, and the etching process, and each of the metal wiring patterns is allocated to and electrically associated with a corresponding semiconductor device on the silicon wafer through the intermediary of via-holes formed in the lowermost and uppermost insulating layers and the insulating interlayer.

When each of the semiconductor chip areas is produced as the semiconductor device, the surface of the silicon wafer is uneven. Accordingly, the lowermost insulating layer formed on the silicon wafer also exhibits unevenness, and the unevenness is gradually amplified as the silicon dioxide layers are formed in order on the lowermost insulating layer. When each plurality of metal wiring patterns are formed on the uneven surface of the corresponding silicon dioxide layer, each of the metal wiring patterns is susceptible to defects and faults, resulting in a decline in a production yield rate of the semiconductor devices.

In order to resolve this problem, whenever each of the silicon dioxide layers is formed, the surface of the silicon dioxide layer is polished, using a chemical mechanical polishing (CMP) method, to thereby planarize the same, and thus it is possible to satisfactorily carry out the formation of each plurality of metal wiring patterns on the planarized surface.

A chemical mechanical polishing (CMP) apparatus for performing the CMP method includes a rotatable disk-like platen having a polishing cloth or pad provided over a top face thereof, a rotatable carrier head disposed above the polishing pad, and an abrasive-slurry feeding nozzle for feeding aqueous abrasive slurry to the polishing pad. Note, usually, the disk-like platen has a diameter which is twice or more than that of the carrier head. The carrier head has a suction pad which can be connected to a suitable vacuum source, and the silicon wafer having the silicon dioxide layer to be polished is held by the carrier head such that the back face of the silicon wafer is sucked by the suction pad. The carrier head can be moved upward and downward with respect to the polishing pad of the disk-like platen having the diameter which is twice or more than that of the carrier head.

In a polishing operation, the disk-like platen is rotated in one rotational direction, and the carrier head carrying the silicon wafer is rotated in the same rotational direction as the disk-like platen. As the aqueous abrasive slurry is dripped from the abrasive-slurry feeding nozzle onto the polishing pad, the rotating silicon wafer is pushed against the rotating polishing pad by the carrier head, whereby the silicon dioxide layer of the silicon wafer can be polished and planarized.

With the recent advance of miniaturization of semiconductor devices, signal-transmission paths included in each metal wiring pattern become closer to each other, and thus a parasitic capacitance is produced between adjacent signal-transmission paths because the silicon dioxide layer serves as a dielectric therebetween. Of course, the production of the parasitic capacitance results in delay of signal transmission in the signal-transmission paths. In short, the miniaturization of the semiconductor devices has advanced to a degree in which a magnitude of a dielectric constant of the silicon dioxide layer cannot be neglected.

Therefore, in the process of producing the semiconductor devices, it has been proposed that an insulating layer, composed of a low-k material having a smaller dielectric constant than that of silicon dioxide, be substituted for the silicon dioxide insulating layer, to thereby suppress the production of the parasitic capacitance, as disclosed in U.S. Pat. No. 6,423,630.

Nevertheless, by the conventional CMP method, it is difficult to efficiently polish the insulating layer composed of the low-k material, because the low-k material insulating layer, such as a SiCOH layer, an MSQ (methyl silsesquioxane) layer or the like, exhibits a hydrophobic nature. Namely, as stated above, although the aqueous abrasive slurry is used in the conventional CMP method, the low-k material insulating layer repels the aqueous abrasive slurry due to the hydrophobic nature thereof, resulting in considerable decline in a polishing rate of the low-k material insulating layer.

After the low-k material insulating layer of the semiconductor wafer is polished by the CMP method, the semiconductor wafer is subjected to a washing process and a rinsing process to thereby remove the aqueous abrasive slurry together with residual substances from the polished insulating layer of the semiconductor wafer. However, the removal of the residual substances from the polished low-k material insulating layer of the semiconductor wafer is very difficult due to the hydrophobic nature thereof, as explained in detail hereinafter.

SUMMARY OF THE INVENTION

Therefore, an object of the present invention is to provide a chemical mechanical polishing method for polishing a low-k material insulating layer formed on a semiconductor wafer, wherein a polishing rate of the low-k material insulating layer can be considerably improved.

Another object of the present invention is to provide such a chemical mechanical polishing method, which is associated with a washing/rinsing method for removing residual substances from a polished low-k material insulating layer of a semiconductor wafer, wherein the removal of the residual substances from the polished low-k material insulating layer of the semiconductor wafer can be easily and effectively performed.

In accordance with an aspect of the present invention, there is provided a chemical mechanical polishing method for polishing a low-k material insulating layer formed on a semiconductor wafer. The chemical mechanical polishing method comprises the steps of: preparing aqueous abrasive slurry composed of a water component, an abrasive component, a first additive for making the low-k material insulating layer of the semiconductor wafer hydrophilic in nature, and a second additive for adding acidity to the aqueous abrasive slurry; feeding the aqueous abrasive slurry to a rotating polishing pad; and applying and pressing the low-k material insulating layer of the semiconductor wafer onto the rotating polishing pad.

The low-k material insulating layer may be formed as either a SiCOH layer or a methyl silsesquioxane layer. Also, preferably, a pressure at which the low-k material insulating layer of the semiconductor wafer is pressed onto the rotating polishing pad falls within a range between approximately 3 psi and approximately 5 psi. Further, the abrasive component may comprise 20 wt % colloidal silica.

The first additive may comprise a hydroxide selected from the group consisting of aluminum hydroxide ($Al(OH)_3$) and potassium hydroxide (KOH). Also, at most 2 wt % of the hydroxide may be contained in the aqueous abrasive slurry.

Preferably, an amount of the second additive contained in the aqueous abrasive slurry is determined such that the aqueous abrasive slurry exhibits a pH falling in a range between approximately 3 and approximately 6.

The chemical mechanical polishing method may be associated with a washing/rinsing method for removing residual substances from a low-k material insulating layer of a semiconductor wafer, polished by the chemical mechanical polishing method using the aforesaid aqueous abrasive slurry. Namely, the washing/rinsing method comprises the steps of: washing the semiconductor wafer, which is drenched with the aqueous abrasive slurry, with an aqueous washing solution; and rinsing the washed semiconductor wafer with pure water, whereby the removal of the residual substances from the polished low-k material insulating layer of the semiconductor wafer is easily and effectively performed.

In the chemical mechanical polishing method according to the present invention, a polishing rate of the low-k insulating layer can be considerably improved, and the removal of the residuary substances from the polished low-k material insulating layer of the semiconductor wafer can be easily and effectively performed.

In accordance with a second aspect of the present invention, there is provided a washing/rinsing method for removing residual substances from a low-k material insulating layer of a semiconductor wafer, chemically and mechanically polished by using an aqueous abrasive slurry composed of a water component, an abrasive component, a first additive for making the low-k material insulating layer of the semiconductor wafer hydrophilic in nature, and a second additive for adding acidity to the aqueous abrasive slurry. The washing/rinsing method comprises the steps of washing the semiconductor wafer, which is drenched with the aqueous abrasive slurry, with an aqueous washing solution, and rinsing the washed semiconductor wafer with pure water.

In the washing/rinsing method, the aqueous washing solution may be prepared as either an aqueous oxalic acid ($C_2H_2O_4$) solution or an aqueous dilute hydrofluoric acid (DHF) solution.

BRIEF DESCRIPTION OF THE DRAWINGS

The above objects and other objects will be more clearly understood from the description set forth below, with reference to the accompanying drawings, wherein:

FIG. 7A is a partial cross-sectional view of a low-k material insulating layer with a silicon dioxide layer formed thereon, showing a first representative step of a production process of producing a semiconductor device featuring a copper wiring-pattern arrangement, to which the chemical mechanical polishing method according to the present invention is applied;

FIG. 7B is a partial cross-sectional view, similar to FIG. 7A, showing a second representative step of the production process, in which a copper wiring-pattern is produced in the low-k material insulating layer and the silicon dioxide layer;

FIG. 7C is a partial cross-sectional view, similar to FIG. 7B, showing a third representative step of the production process, in which the silicon dioxide layer is polished so as to be substantially removed from the low-k material insulating layer;

DESCRIPTION OF THE PREFERRED EMBODIMENTS

Figure 1:
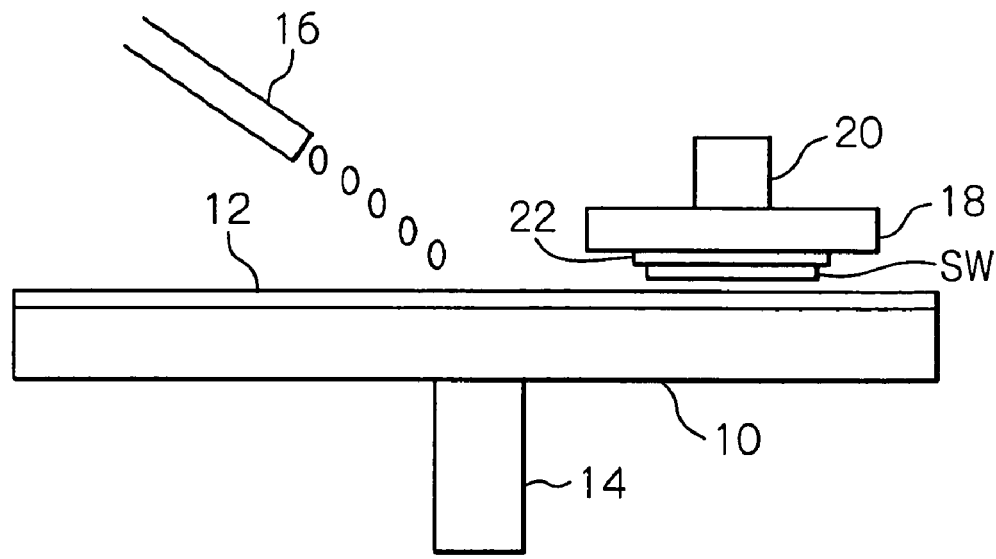
FIG. 1 is a schematic elevation view of a chemical mechanical polishing apparatus for executing a chemical mechanical polishing method according to the present invention.

With reference to FIG. 1, a chemical mechanical polishing (CMP) apparatus for performing a CMP method according to the present invention is schematically shown.

The CMP apparatus includes a rotatable disk-like platen 10 having a polishing cloth or pad 12 securely attached to a top face thereof, and a shaft 14 protruded from a center of a bottom face thereof. The shaft 14 is operationally connected to an electric motor (not shown) associated with a suitable drive transmission. The CMP apparatus also includes an abrasive-slurry feeding nozzle 16 for feeding aqueous abrasive slurry to the polishing pad 12.

The CMP apparatus further includes a rotatable carrier head 18 having a shaft 20 which is operationally connected to an electric motor (not shown) associated with a suitable drive transmission. Note that the disk-like platen 10, and therefore, the polishing pad 12, has a diameter which is twice or more than that of the carrier head 18. Although not illustrated, the electric motor for the carrier head 18 is supported by a mechanical drive system such that the carrier head 18 is moved upward and downward. Also, the carrier head 18 is provided with a suction pad 22 which is formed with perforations connected to a suitable vacuum source (not shown), and thus a silicon wafer SW can be securely sucked to and held by the suction pad 22, as shown in FIG. 1.

The silicon wafer SW has an insulating layer formed on a front face thereof, in which a plurality of semiconductor devices are already produced. According to the present invention, the insulating layer is composed of a suitable low-k material, such as a material containing a methyl radical. Namely, the insulating layer is produced as an MSQ (methyl silsesquioxane) layer, a SiCOH layer or the like, using a chemical vapor deposition (CVD) process. Strictly speaking, the silicon wafer SW is held by the carrier head 18 such that a back face of the silicon wafer SW is sucked to the suction pad 22.

Usually, in the aforesaid conventional CMP method, aqueous abrasive slurry is composed of only two components: a water component, and an abrasive component, and exhibits neutrality or weak alkalinity. For example, for the abrasive component, fumed silica particles are used. Namely, a given amount of fumed silica particles are mixed with and suspended in the water, to thereby prepare the aqueous abrasive slurry.

According to the present invention, similar to the aqueous abrasive slurry used in the conventional CMP method, although the aqueous abrasive slurry is composed of a water component, and an abrasive component, it further contains a first additive for making the low-k material insulating layer of the silicon wafer SW hydrophilic in nature, and a second additive for adding acidity to the aqueous abrasive slurry. The first additive may be composed of a suitable hydroxide component, such as aluminum hydroxide ($Al(OH)_3$), potassium hydroxide (KOH) or the like. Also, the second additive may be composed of a suitable acid component, such as acetic acid ($CH_3OOH$), hydrochloric acid (HCl) or the like.

In the CMP method according to the present invention, it is possible to drench the low-k material insulating layer of the silicon wafer SW with the aqueous abrasive slurry, due to the existence of the hydroxyl groups of the first additive or hydroxide component in the aqueous abrasive slurry, and thus the low-k material insulating layer of the silicon wafer SW can be efficiently polished without the aqueous abrasive slurry's being repelled from the low-k material insulating layer of the silicon wafer SW.

If the aqueous abrasive slurry exhibits alkalinity, the low-k material insulating layer of the silicon wafer SW may be subjected to chemical decomposition. However, since the aqueous abrasive slurry used in the CMP method according to the present invention exhibits the acidity due to the second additive or acid component contained in the aqueous abrasive slurry, it thus is possible to completely prevent the chemical decomposition of the low-k material insulating layer.

EXAMPLE I

A first CMP test was performed in accordance with the present invention, as follows:

a) An 8-inch silicon wafer (SW) was prepared, and a SiCOH layer (k=2.9) having a thickness of approximately 4,000 A was produced and formed as a low-k material insulating layer on the 8-inch silicon wafer (SW) by a CVD process. Note that "k" represents a dielectric constant of the SiCOH layer.

b) Aqueous abrasive slurry was prepared according to the present invention. Namely, the prepared aqueous abrasive slurry was composed of a water component, an abrasive component of 20 wt % colloidal silica, a first additive of 2 wt % aluminum hydroxide ($Al(OH)_3$), and a second additive of hydrochloric acid (HCl). Note, an amount of the hydrochloric acid (HCl) was determined such that the aqueous abrasive slurry exhibited approximately pH4. Also, note, by oxidizing a surface of the SiCOH layer with the second additive, the hydrophilic nature of the surface of the SiCOH layer can be further improved.

c) The SiCOH layer of the 8-inch silicon wafer (SW) was polished, using the CMP apparatus as schematically shown in FIG. 1, under the conditions that both the disk-like platen 10 and the carrier head 18 was driven in the same rotational direction at the same low rotational speed of 32 rpm, that the 8-inch silicon wafer (SW) was pushed against the polishing pad 14 under a low polishing pressure 3 psi, and that the aqueous abrasive slurry was dripped from the abrasive-slurry feeding nozzle 16 onto the polishing pad 14 at a rate of 150 ml/min.

Figure 2:
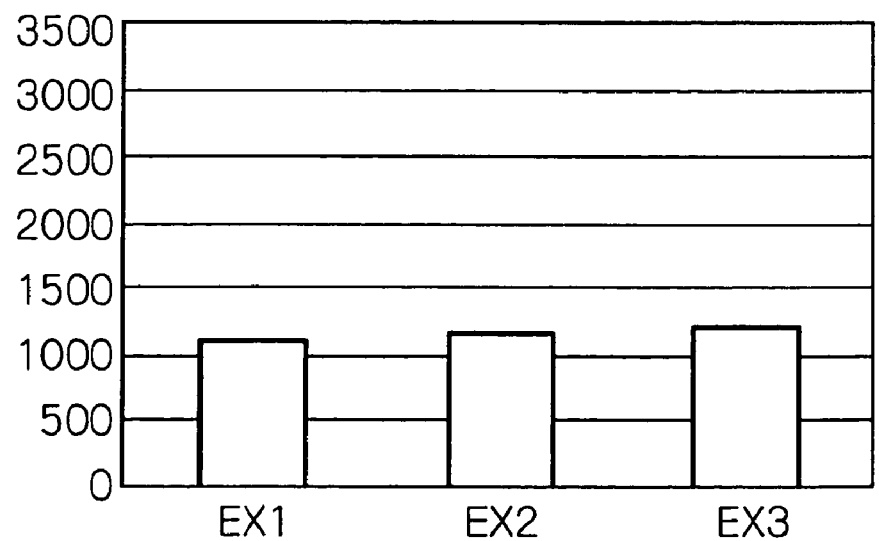
FIG. 2 is a bar graph showing polishing rates obtained from chemical mechanical polishing tests performed in accordance with the chemical mechanical polishing method for the present invention, using the chemical mechanical polishing apparatus as shown in FIG. 1.

As a result, a polishing rate of approximately 1,100 A/min was obtained, as indicated by reference EX1 in a bar graph of FIG. 2.

EXAMPLE II

A second CMP test was performed in accordance with the present invention under substantially the same conditions as EXAMPLE I, except that a SiCOH layer of an 8-inch silicon wafer (SW), having a thickness of approximately 4,000 A, was pushed against the polishing pad 14 under a low polishing pressure 4 psi.

As a result, a polishing rate of approximately 1,200 A/min was obtained, as indicated by reference EX2 in the bar graph of FIG. 2.

EXAMPLE III

A third CMP test was performed in accordance with the present invention under substantially the same conditions as EXAMPLE I, except that a SiCOH layer of an 8-inch silicon wafer (SW), having a thickness of approximately 4,000 A, was pushed against the polishing pad 14 under a low polishing pressure 5 psi.

As a result, a polishing rate of approximately 1,300 A/min was obtained, as indicated by reference EX3 in the bar graph of FIG. 2.

As is apparent from EXAMPLES I, II, and III, the higher the polishing pressure, the larger the polishing rate. Nevertheless, a high polishing pressure of more than 8 psi is undesirable because scratches appear over a polished surface of the low-k material insulating layer.

Also, in EXAMPLES I, II, and III, although the rotational speed of the both the disk-like platen 10 and the carrier head 18 was varied within a low rotational speed range from 28 to 38 rpm, the polishing rates of 1,100, 1,200, and 1,300 A/min were not substantially subjected to fluctuation.

COMPARATIVE EXAMPLE I

A first comparative CMP test was performed under substantially the same conditions as EXAMPLE I according to the present invention, except that a silicon dioxide ($SiO_2$) layer having a thickness of approximately 4,000 A was produced and formed on an 8-inch silicon wafer (SW) by a CVD process, and that conventional aqueous abrasive slurry was substituted for the aqueous abrasive slurry according to the present invention. Note, as stated above, usually, the conventional aqueous abrasive slurry is composed of only two components: a water component, and an abrasive component (fumed silica).

Figure 3:
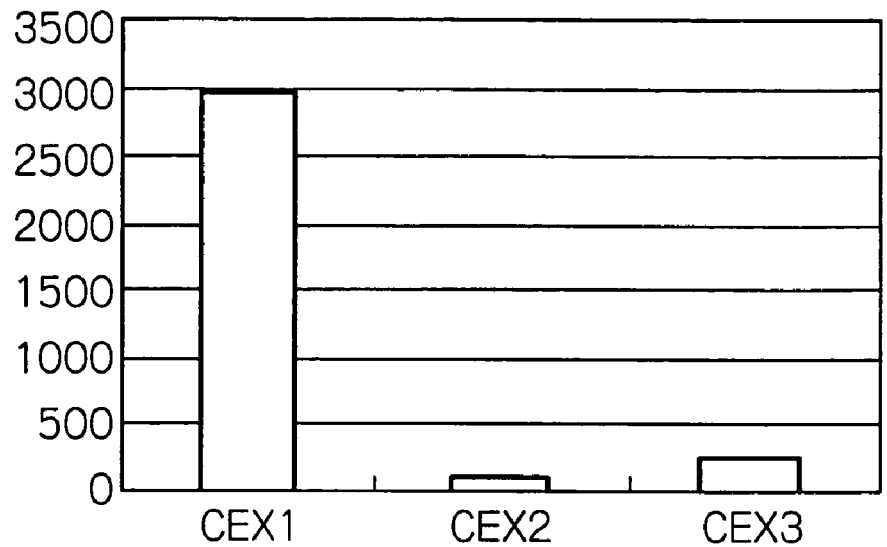
FIG. 3 is a bar graph showing polishing rates obtained from comparative chemical mechanical polishing tests in accordance with a conventional chemical mechanical polishing method, using the chemical mechanical polishing apparatus as shown in FIG. 1.

As a result, a polishing rate of approximately 3,000 A/min was obtained, as indicated by reference CXE1 in a bar graph of FIG. 3.

COMPARATIVE EXAMPLE II

A second comparative CMP test was performed under substantially the same conditions as COMPARATIVE EXAMPLE I, except that a SiCOH layer (k=2.9) having a thickness of approximately 4,000 A was produced and formed as a low-k material insulating layer on an 8-inch silicon wafer (SW) by a CVD process.

As a result, a polishing rate of approximately 100 A/min was obtained, as indicated by reference CXE2 in the bar graph of FIG. 3.

COMPARATIVE EXAMPLE III

A third comparative CMP test was performed under substantially the same conditions as COMPARATIVE EXAMPLE II, except that a SiCOH layer (k=2.9) of an 8-inch silicon wafer (SW), having a thickness of approximately 4,000 A, was pushed against the polishing pad 14 under a high polishing pressure 8 psi.

As a result, a polishing rate of approximately 300 A/min was obtained, as indicated by reference CEX3 in the bar graph of FIG. 3.

Although the polishing rates of 1,100, 1,200, and 1,300 A/min according to the present invention are inferior to the polishing rate of 3,000 A/min in COMPARATIVE EXAMPLE I, it is possible to adjust the polishing rates of 1,100, 1,200, and 1,300 A/min fit to suit practical use. On the other hand, the polishing rates 100 and 300 A/min in COMPARATIVE EXAMPLES II and III are too small to make them practical.

Figure 4:
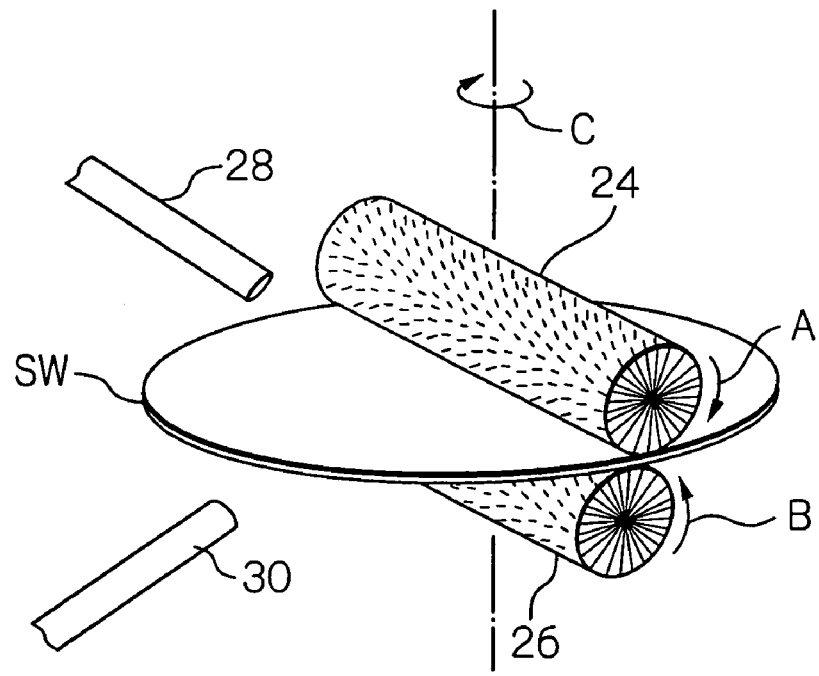
FIG. 4 is a schematic perspective view of a wafer washing apparatus of a silicon wafer polished by the chemical mechanical polishing apparatus as shown in FIG. 1.

With reference to FIG. 4, a washing apparatus for washing the polished silicon wafer SW is schematically shown.

The washing apparatus includes a pair of cylindrical brushes 24 and 26, which are reversely rotated around their longitudinal center axes with respect to each other, as indicated by arrows A and B in FIG. 4, and which are rotated around a vertical center axis crossing the longitudinal center axes at a right angle, as indicated by an arrow C in FIG. 4.

Also, the washing apparatus includes a pair of washing-solution-feeding nozzles 28 and 30 which are associated with the brushes 24 and 26 such that respective aqueous washing solutions are fed to the brushes 24 and 26, whereby the respective front and back faces of the silicon wafer SW are securely washed with the aqueous washing solutions. In this embodiment, the aqueous washing solution may be prepared as an aqueous oxalic acid ($C_2H_2O_4$) solution, an aqueous dilute hydrofluoric acid (DHF) solution or the like.

According to the present invention, as soon as the silicon wafer SW is polished by the CMP apparatus (FIG. 1), it is transferred to the washing apparatus. Namely, in a washing operation, the polished silicon wafer SW, which is drenched with the aqueous abrasive slurry, is moved through a nip between the rotating brushes 24 and 26, and is washed with the aqueous washing solution fed from the washing-solution-feeding nozzles 28 and 30. Thus, since the front and back faces of the polished silicon wafer SW still exhibit the hydrophilic nature due to the existence of the aqueous abrasive slurry, these faces can be sufficiently treated with the aqueous washing solution without the front and back faces of the polished silicon wafer SW repelling the aqueous washing solution, whereby the aqueous abrasive slurry can be removed together with residual substances from the polished low-k material insulating layer of the silicon wafer SW.

Figure 5:
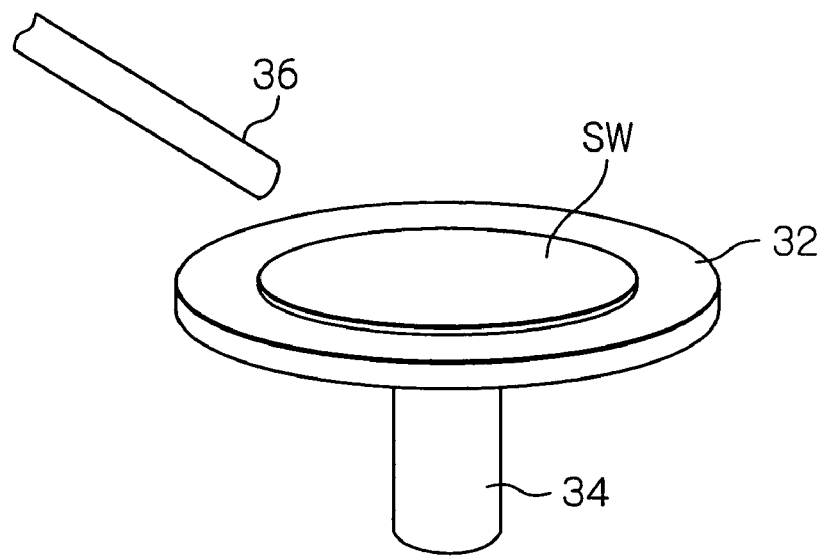
FIG. 5 is a schematic perspective view of a wafer rinsing apparatus of a silicon wafer washed by the wafer washing apparatus as shown in FIG. 4.

With reference to FIG. 5, a rinsing apparatus for rinsing the washed silicon wafer SW is schematically shown.

The rinsing apparatus includes a rotatable table 32 having a shaft 34 protruded from a center of a bottom face of thereof, and the shaft 34 is operationally connected to an electric motor (not shown) associated with a suitable drive transmission. The rotatable table 32 is formed with perforations which are connected to a suitable vacuum source (not shown), and thus the washed silicon wafer SW can be securely sucked to and held by the rotatable table 32, as shown in FIG. 5. The rinsing apparatus also includes a rinsing-water-feeding nozzle 36 for feeding pure water to the washed silicon wafer SW.

After the silicon wafer SW is washed by the washing apparatus shown in FIG. 4, it is transferred to the rinsing apparatus. In a rinsing operation, the pure water is fed from the rinsing-water-feeding nozzle 36 to the rotating silicon wafer SW, whereby the washing solution is removed therefrom.

Figure 6:
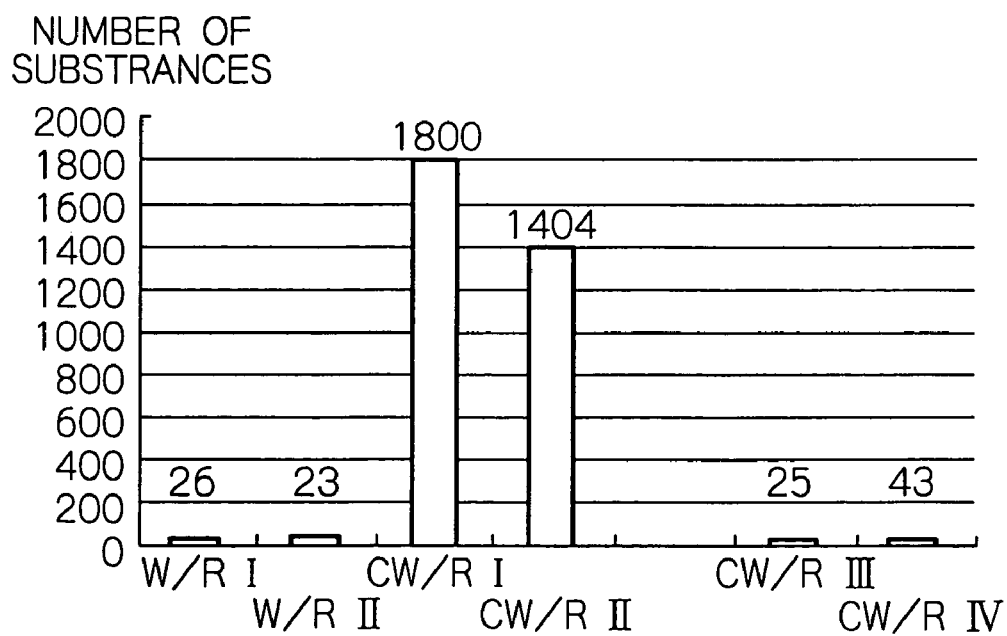
FIG. 6 is a bar graph showing a number of residual substances on each of washed and rinsed silicon wafers, which is counted using a well-known residual-substance-inspection apparatus.

In order to ascertain whether or not the aforesaid washing and rinsing processes can be properly carried out, first and second washing/rinsing tests were carried out in accordance with the present invention as follows:

In the first washing/rinsing test, a first 8-inch silicon wafer (SW), on which a SiCOH layer having a thickness of approximately 4,000 A was formed, was prepared and polished by using the same aqueous abrasive slurry as used in the aforesaid EXAMPLES I, II and III. As soon as the polishing process was completed, the first 8-inch silicon wafer (SW), which was drenched with the aqueous abrasive slurry, was washed by the washing apparatus as shown in FIG. 4, and then was rinsed by the rinsing apparatus as shown in FIG. 5. Thereafter, a total number of residual substances, which were left on the first washed and rinsed silicon wafer (SW), was counted by using a residual-substance-inspection apparatus which is well known in this field. Note, in this inspection, a residual substance having a size of more than 0.2 µm was counted. The counted total number residual substances was "26", as indicated by reference "W/R I" in a bar graph of FIG. 6.

In the second washing/rinsing test, a second 8-inch silicon wafer (SW), on which a SiCOH layer having a thickness of approximately 4,000 A was formed, was prepared and processed in substantially the same manner as the first washing/rinsing test. Then, a total number of residual substances on the second washed and rinsed silicon wafer (SW) was counted by using the residual-substance-inspection apparatus. The counted total number of residual substances was "23", as indicated by reference "W/R II" in the bar graph of FIG. 6.

Further, first, second, third and fourth comparative washing/rinsing tests were carried out.

In the first comparative washing/rinsing test, a first 8-inch silicon wafer (SW), on which a SiCOH layer having a thickness of approximately 4,000 A was formed, was prepared and polished by using the same conventional aqueous abrasive slurry as used in the aforesaid COMPARATIVE EXAMPLE I. As soon as the polishing process was completed, the first 8-inch silicon wafer (SW), which was drenched with the conventional aqueous abrasive slurry, was washed by the washing apparatus as shown in FIG. 4, and then was rinsed by the rinsing apparatus as shown in FIG. 5. Thereafter, a total number of residual substances, which were left on the first washed and rinsed silicon wafer (SW), was counted by using the residual-substance-inspection apparatus. The counted total number of residual substances was "1,800", as indicated by reference "CW/R I" in the bar graph of FIG. 6.

In the second comparative washing/rinsing test, a second 8-inch silicon wafer (SW), on which a SiCOH layer having a thickness of approximately 4,000 A was formed, was prepared and processed in substantially the same manner as the first comparative washing/rinsing test. Then, a total number of residual substances on the second washed and rinsed silicon wafer (SW) was counted by using the residual-substance-inspection apparatus. The counted total number of residual substances was "1404", as indicated by reference "CW/R II" in the bar graph of FIG. 6.

In the third comparative washing/rinsing test, a third 8-inch silicon wafer (SW), on which a silicon dioxide (SiO$_2$) layer having a thickness of approximately 4,000 A was formed, was prepared and polished by using the same conventional aqueous abrasive slurry as used in the aforesaid COMPARATIVE EXAMPLE I. As soon as the polishing process was completed, the third 8-inch silicon wafer (SW), which was drenched with the conventional aqueous abrasive slurry, was washed by the washing apparatus as shown in FIG. 4, and then was rinsed by the rinsing apparatus as shown in FIG. 5. Thereafter, a total number of residual substances left on the third washed and rinsed silicon wafer (SW) was counted by using the residual-substance-inspection apparatus. The counted total number of residual substances was "25", as indicated by reference "CW/R III" in the bar graph of FIG. 6.

In the fourth comparative washing/rinsing test, a fourth 8-inch silicon wafer (SW), on which a silicon dioxide (SiO$_2$) layer having a thickness of approximately 4,000 A was formed, was prepared and processed in substantially the same manner as the third comparative washing/rinsing test. Then, a total number of residual substances on the fourth washed and rinsed silicon wafer (SW) was counted by using the residual-substance-inspection apparatus. The counted total number of residual substances was "43", as indicated by reference "CW/R II" in the bar graph of FIG. 6.

Note, in general, when the total number of residual substances left on a washed and rinsed 8-inch silicon wafer (SW) is less than "100", this silicon wafer may be handled as being acceptable.

The CMP method according to the present invention can be advantageously applied to a process of producing a semiconductor device featuring a copper wiring-pattern arrangement, as explained below.

With reference to FIG. 7A, a low-k material insulating layer 38 is partially shown as being formed on a silicon wafer (not shown) in which a plurality of semiconductor devices is produced, and a silicon dioxide layer 40 is formed on the low-k material insulating layer 38. Then, a photoresist layer (not shown) is formed on the silicon dioxide layer 40, and is patterned by using a photolithography process and an etching process so that a plurality of hollow patterns are formed in both the layers 38 and 40 so as to be allocated to the respective semiconductor devices. Subsequently, the photoresist layer is removed from the silicon dioxide layer 40, and the surface of the silicon dioxide layer 40 is subjected to a sputtering process such that the hollow patterns are filled with copper, with the silicon dioxide layer 40 being covered with a copper layer, as shown in FIG. 7B. Thus, each of the hollow patterns is produced as a copper wiring pattern.

As representatively shown in FIG. 7B, each of the copper wiring patterns may include a large-scale pattern section 42 formed as a copper region, and a concentration pattern section 44 in which a plurality of copper conducting paths 46 are arranged to be close to each other. When the silicon dioxide layer 40 is polished by a conventional CMP method for a formation of the copper wiring-pattern arrangement, the large-scale pattern section 42 and the concentration pattern section 44 are subjected to a larger polishing rate in comparison with other pattern sections, and thus the polished surface is uneven, as shown in FIG. 7C.

Namely, as is apparent from FIG. 7C, each of the polished sections 42 and 44 is shaped and produced as a dish-like depression. The wider the area of the large-scale pattern section 42, the deeper the dish-like depression produced at the large-scale pattern section 42. Also, the closer the copper conducting paths 46, the deeper the dish-like depression produced at the concentration pattern section 44.

Note, in the aforesaid conventional CMP method for the formation of the copper wiring-pattern arrangement, aqueous abrasive slurry, which is specially prepared for the purpose of polishing a silicon dioxide layer with copper wiring-patterns, is used, and contains an erosion component for eroding copper.

Figure 7D:
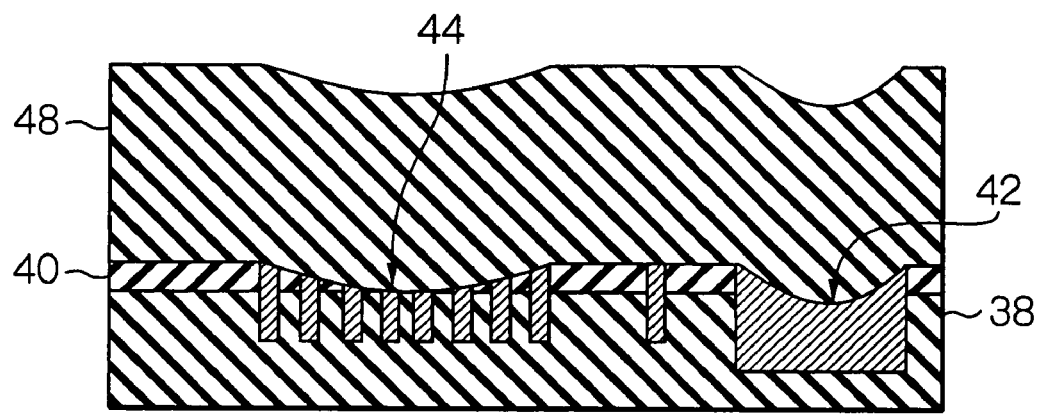
FIG. 7D is a partial cross-sectional view, similar to FIG. 7C, showing a fourth representative step of the production process, in which another low-k material insulating layer is formed on the polished surface.
Figure 7E:
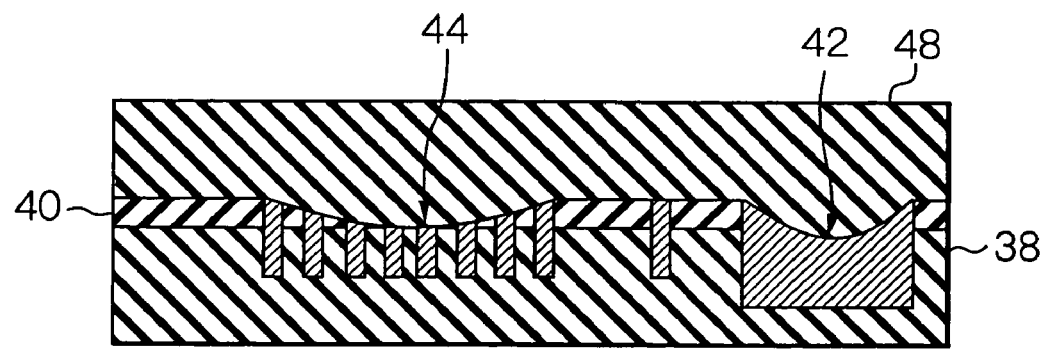
FIG. 7E is a partial cross-sectional view, similar to FIG. 7E, showing a fifth representative step of the production process, in which the other low-k material insulating layer is polished by using the chemical mechanical polishing method according to the present invention.

Then, as shown in FIG. 7D, when a low-k material insulating layer 48 is formed on the polished uneven surface, using a CVD process, it features an uneven surface in conformity with the polished uneven surface. It is possible to efficiently planarize the uneven surface of the low-k material insulating layer 48, using the CMP method according the present invention, as shown in FIG. 7E.

The inventor performed a planarization test on an uneven surface of a low-k material insulating layer (48) having a thickness of 5,000 A, in which a first dish-like depression having a depth of approximately 640 A, a second dish-like depression having a depth of approximately 530 A, a third dish-like depression having a depth of approximately 610 A, a fourth dish-like depression having a depth of approximately 950 A, and a fifth dish-like depression having a depth of approximately 1,060 A were produced.

Note, each of the first, second and third dish-like depressions was derived from a concentration pattern section as defined above, and each of the fourth and fifth dish-like depressions was derived from a large-scale pattern section as defined above.

Figure 8:
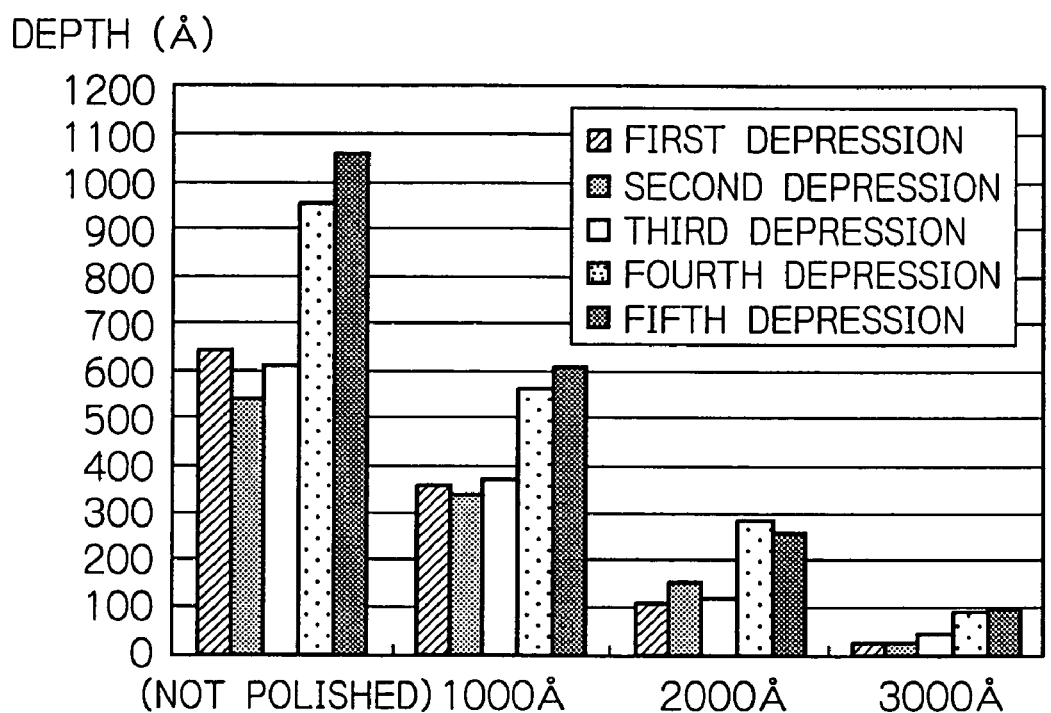
FIG. 8 is a bar graph showing results of planarization tests performed when polishing an uneven surface of the low-k material insulating layer as shown in FIG. 7E.

The results are shown in a bar graph of FIG. 8. As is apparent from this bar graph, when the low-k material insulating layer (48) is not still polished, the unevenness of the low-k material insulating layer (48) features a maximum undulation, which is represented by the depth (1,060 A) of the fifth dish-like depression. However, when the low-k material insulating layer (48) is polished by a thickness of 1,000 A, the maximum undulation is reduced to approximately 600 A. Also, when the low-k material insulating layer (48) is polished by a thickness of 2,000 A, the maximum undulation is reduced to approximately 280 A. Further, when the low-k material insulating layer (48) is polished by a thickness of 3,000 A, the maximum undulation is reduced to approximately 100 A.

In this field, in general, when a polished surface features a maximum undulation of less than 300 A, it may be regarded as a planarized surface.

In the above-mentioned embodiments, although the aqueous abrasive slurry used in the CMP method according to the present invention contains colloidal silica as the abrasive component, fumed silica may be substituted for colloidal silica.

Also, although the aqueous abrasive slurry contains aluminum hydroxide (Al(OH)$_3$) to make the low-k material insulating layer of the silicon wafer hydrophilic in nature, another hydroxide, such as potassium hydroxide (KOH) or the like may be substituted for aluminum hydroxide (Al(OH)$_3$). In the above-mentioned embodiment, although the amount of aluminum hydroxide (Al(OH)$_3$) contained in the aqueous abrasive slurry is 2 wt %, this amount is variable as long as the low-k material insulating layer of the silicon wafer can be made hydrophilic in nature.

Further, although the amount of the second additive or hydrochloric acid (HCl) is determined such that the aqueous abrasive slurry exhibits approximately pH4, this slurry may exhibit more than pH3, preferably a pH falling in a range between 4 and 6.

Finally, it will be understood by those skilled in the art that the foregoing description is of preferred embodiments of the methods, and that various changes and modifications may be made to the present invention without departing from the spirit and scope thereof.

What is claimed is:

1. A chemical mechanical polishing method for polishing a low-k material insulating layer formed on a semiconductor wafer, which method comprises:

preparing an aqueous abrasive slurry composed of a water component, an abrasive component, a first additive for making the low-k material insulating layer of said semiconductor wafer hydrophilic in nature, and a second additive for adding acidity to said aqueous abrasive slurry, wherein said low-k material insulating layer is formed as a SiCOH layer or as a methyl silsesquioxane layer;

feeding said aqueous abrasive slurry to a rotating polishing pad; and applying and pressing the low-k material insulating layer of said semiconductor wafer onto said rotating polishing pad washing said semiconductor wafer, which is drenched with said aqueous abrasive slurry, with an aqueous washing solution; and rinsing the washed semiconductor wafer.

2. A chemical mechanical polishing method as set forth in claim 1, wherein a pressure at which the low-k material insulating layer of said semiconductor wafer is pressed onto said rotating polishing pad falls within a range between approximately 3 psi and approximately 5 psi.

3. A chemical mechanical polishing method as set forth in claim 1, wherein said abrasive component comprises 20 wt % colloidal silica.

4. A chemical mechanical polishing method as set forth in claim 1, wherein said first additive comprises a hydroxide selected from the group consisting of aluminum hydroxide (Al(OH)$_3$) and potassium hydroxide (KOH).

5. A chemical mechanical polishing method as set forth in claim 4, wherein at most 2 wt % of said hydroxide is contained in said aqueous abrasive slurry.

6. A chemical mechanical polishing method as set forth in claim 1, wherein an amount of said second additive contained in said aqueous abrasive slurry is determined such that said aqueous abrasive slurry exhibits a pH falling in a range between approximately 3 and approximately 6.

7. A chemical mechanical polishing method as set forth in claim 1, wherein said low-k material insulating layer exhibits a dielectric constant of at most 3.0.

8. A chemical mechanical polishing method as set forth in claim 1, further comprising:

rinsing the washed semiconductor wafer with pure water.

9. A chemical mechanical polishing method as set forth in claim 8, wherein said aqueous washing solution is prepared as an aqueous oxalic acid ($C_2H_2O_4$) solution.

10. A chemical mechanical polishing method as set forth in claim 8, wherein said aqueous washing solution is prepared as an aqueous dilute hydrofluoric acid (DHF) solution.

11. A chemical mechanical polishing method as set forth in claim 1, wherein said low-k material insulating layer is formed of a material having a methyl radical.

12. A chemical mechanical polishing method as set forth in claim 1, wherein said semiconductor wafer layer is covered with said low-k material insulating layer.

* * * * *